United States Patent [19]

Cheng et al.

[11] Patent Number: 4,842,683
[45] Date of Patent: Jun. 27, 1989

[54] MAGNETIC FIELD-ENHANCED PLASMA ETCH REACTOR

[75] Inventors: David Cheng, San Jose; Dan Maydan; Sasson Somekh, both of Los Altos Hills; Kenneth R. Stalder, Redwood City; Dana L. Andrews, Mountain View; Mei Chang, San Jose; John M. White, Hayward; Jerry Y. K. Wong, Fremont; Vladimir J. Zeitlin, Santa Clara; David N. Wang, Cupertino, all of Calif.

[73] Assignee: Applied Materials, Inc., Santa Clara, Calif.

[21] Appl. No.: 185,215

[22] Filed: Apr. 25, 1988

Related U.S. Application Data

[63] Continuation-in-part of Ser. No. 147,594, Jan. 22, 1988, which is a continuation of Ser. No. 944,843, Dec. 19, 1986, abandoned.

[51] Int. Cl.[4] .................. B44C 1/22; C03C 15/00; C03C 25/06; H01L 21/306
[52] U.S. Cl. .................... 156/345; 156/643; 156/646; 204/298
[58] Field of Search ............... 156/345, 643, 646, 656, 156/657, 659.1, 662; 204/192.32, 298; 118/50.1, 620, 623, 724, 728; 427/39.39; 134/1, 105

[56] References Cited

U.S. PATENT DOCUMENTS

| | | | |
|---|---|---|---|
| 3,566,960 | 3/1971 | Stuart | 204/298 X |
| 4,282,924 | 8/1981 | Faretra | 165/80 E |
| 4,508,161 | 4/1985 | Holden | 165/1 |
| 4,680,061 | 7/1987 | Lamont | 250/398 |
| 4,724,621 | 2/1988 | Hobson et al. | 34/218 |
| 4,764,076 | 8/1988 | Layman et al. | 414/217 |

FOREIGN PATENT DOCUMENTS 50-139082 4/1974 Japan .

OTHER PUBLICATIONS

Perkins et al, IBM Tech. Dis. Bul., vol. 13, No. 5, 10/70, p. 1182, "Cooling of Chrome Glass Plates Produced by RF Sputter Etch".
Bauer et al, IBM Tech. Dis. Bul., vol. 16, No. 10, 3/74, p. 3289, "Vacuum Holding and Testing Fixture".
Hammer, IBM Tech. Dis. Bul., vol. 19, No. 6, 11/76, pp. 2270-2271, "Cooling Ion-Implantation Target".

Primary Examiner—William A. Powell
Attorney, Agent, or Firm—Flehr, Hohbach, Test, Albritton & Herbert

[57] ABSTRACT

A magnetic field enhanced single wafer plasma etch reactor is disclosed. The features of the reactor include an electrically-controlled stepped magnetic field for providing high rate uniform etching at high pressures; temperature controlled reactor surfaces including heated anode surfaces (walls and gas manifold) and a cooled wafer supporting cathode; and a unitary wafer exchange mechanism comprising wafer lift pins which extend through the pedestal and a wafer clamp ring. The lift pins and clamp ring are moved vertically by a one-axis lift mechanism to accept the wafer from a co-operating external robot blade, clamp the wafer to the pedestal and return the wafer to the blade. The electrode cooling combines water cooling for the body of the electrode and a thermal conductivity-enhancing gas parallel-bowed interface between the wafer and electrode for keeping the wafer surface cooled despite the high power densities applied to the electrode. A gas feed-through device applies the cooling gas to the RF powered electrode without breakdown of the gas. Protective coatings/layers of materials such as quartz are provided for surfaces such as the clamp ring and gas manifold. The combination of these features provides a wide pressure regime, high etch rate, high throughput single wafer etcher which provides uniformity, directionality and selectivity at high gas pressures, operates cleanly and incorporates in-situ self-cleaning capability.

16 Claims, 6 Drawing Sheets

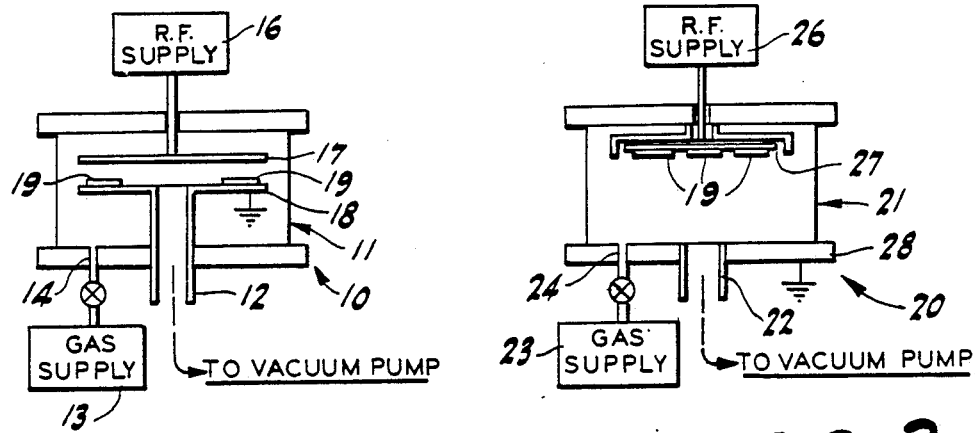
FIG-1 PRIOR ART
FIG-2 PRIOR ART
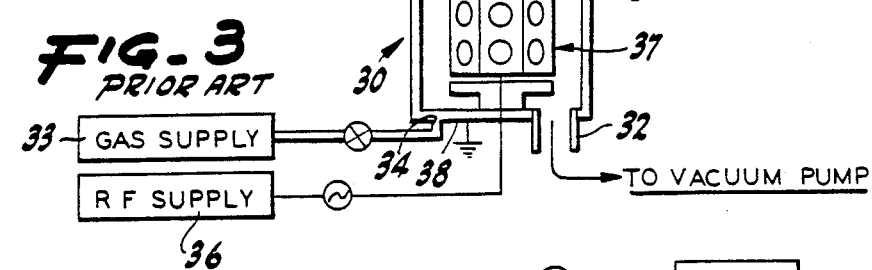
FIG-3 PRIOR ART
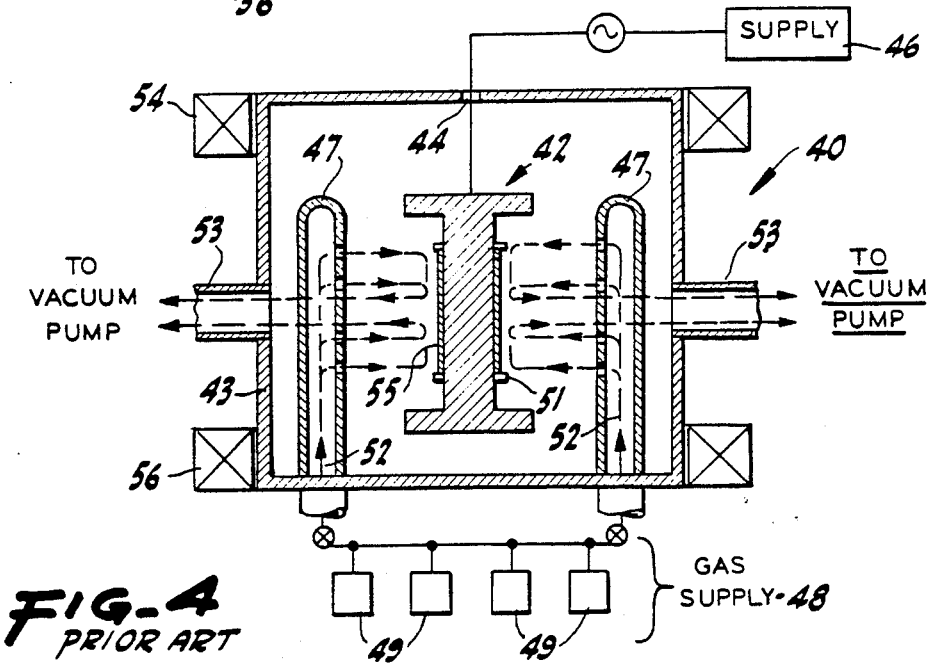
FIG-4 PRIOR ART

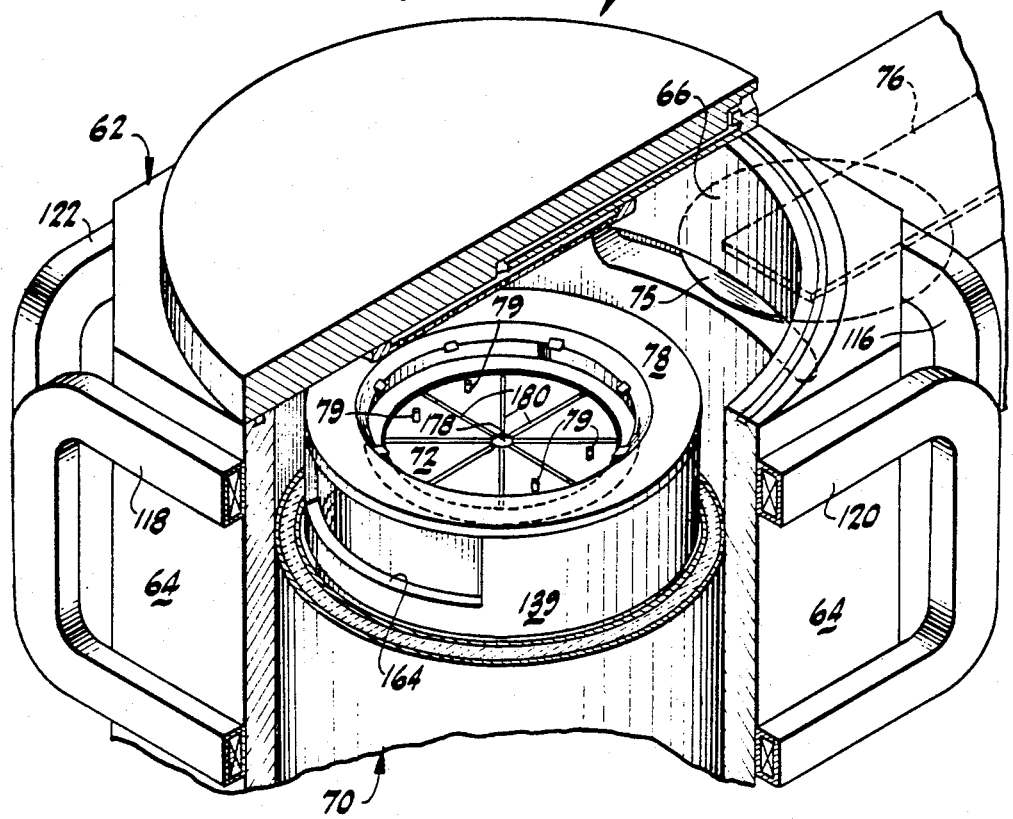
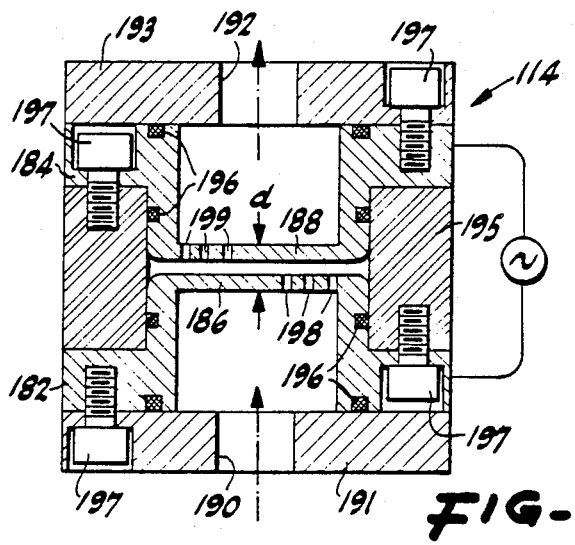
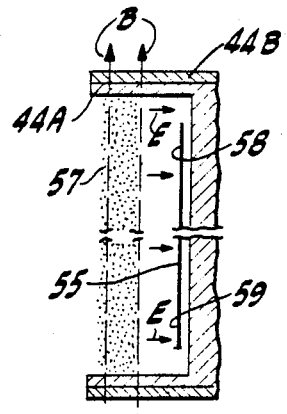

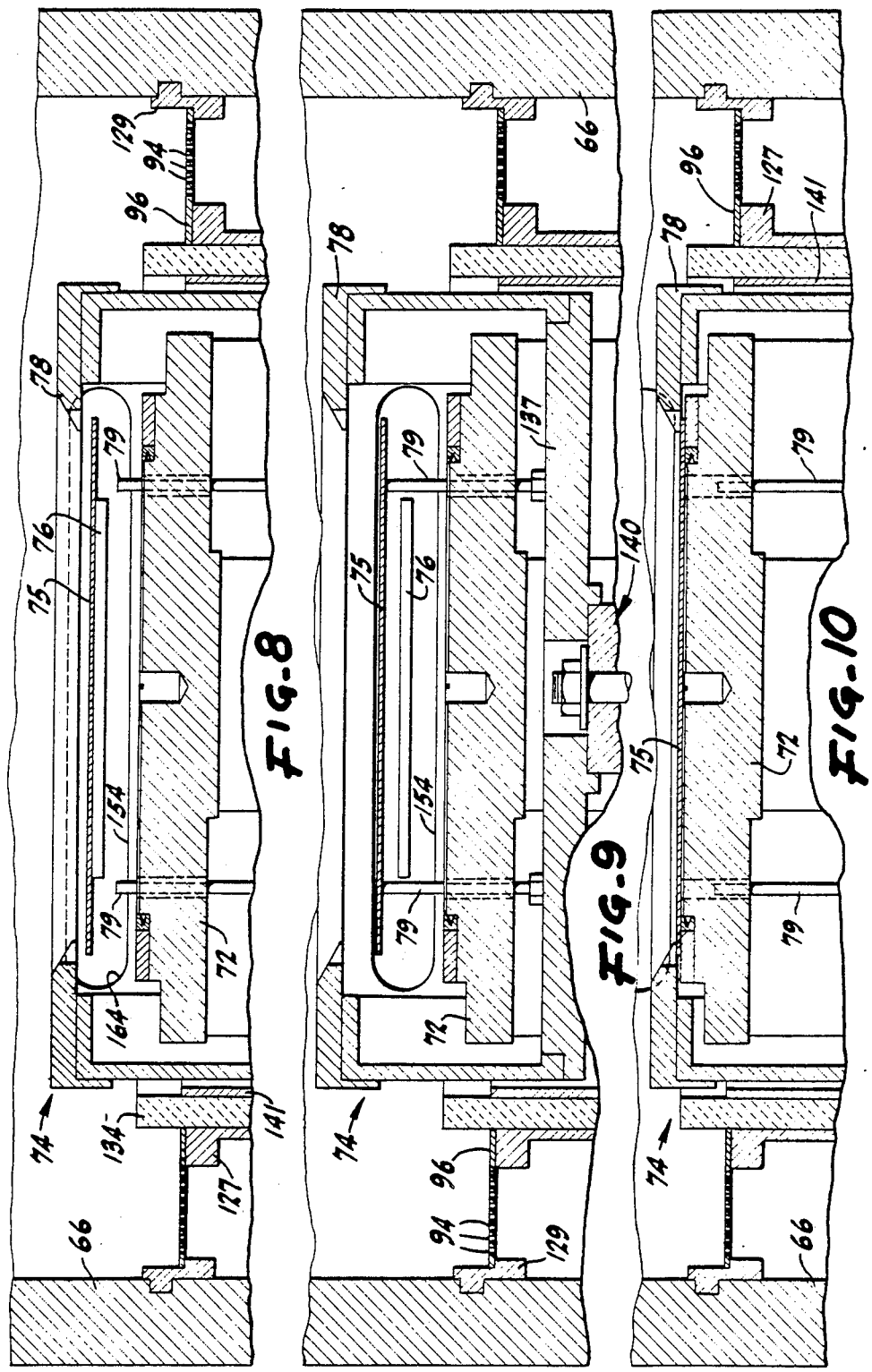

MAGNETIC FIELD-ENHANCED PLASMA ETCH REACTOR

This is a continuation-in-part patent application of Cheng et al U.S. patent application, Ser. No. 147,594, filed Jan. 22, 1988, which is a continuation of Cheng et al U.S. patent application, Ser. No. 944,843, filed Dec. 19, 1986, now abandoned.

BACKGROUND OF THE INVENTION

The present invention relates to a magnetic field-enhanced etch reactor suitable for both plasma etching and reactive ion etching (RIE) mode plasma etching and, to associated processes for etching semiconductor, conductor and dielectric materials.

Over the last several years, the trend to ever greater device densities and smaller minimum feature sizes and smaller separations in integrated circuits has caused the IC fabrication technology to shift from wet chemical etching to dry or plasma etching technology.

The art includes at least three types of plasma etching systems. FIG. 1 depicts a parallel plate plasma, multiple wafer chemical etching system 10, which includes a closed reaction chamber 11 with a connection 12 to a vacuum pump for partially evacuating the interior of the chamber, and a gas supply 13 for communicating the reactive gas to the chamber through a valve-controlled conduit arrangement 14. The system 10 also includes an energy source 16 which supplies RF energy to a cathode structure 17 and utilizes a grounded anode 18. The wafers 19 are mounted on the grounded anode 18 which extends in a parallel plate configuration relative to the cathode 17. The connection to the vacuum pump is configured to draw the reactive gases into the region between the anode 18 and the cathode 17 for confining the reactive gas plasma formed by the RF energy supplied to the cathode 17.

FIG. 2 depicts a parallel plate reactive ion etching mode, plasma etching system 20, which also includes a substantially closed reaction chamber 21 with a connection 22 to a vacuum pump for partially evacuating the interior of the chamber, a gas supply 23 for communicating the reactive gas to the chamber through a valve-controlled conduit arrangement 24, an RF power supply 26 which supplies RF energy to a cathode structure 27 and a grounded anode 28. In contrast to plasma system 10, FIG. 1, in the reactive ion etching system 20, the wafers 19 are mounted on the cathode 27, which is shielded from and separated from the anode 28.

FIG. 3 schematically illustrates another RIE mode etching system, 30, which, like reactors 10 and 20, is available commercially from Applied Materials, Inc. of Santa Clara, Calif. System 30 includes a cylindrical reaction chamber 31, a hexagonal cathode 37 connected to an RF supply 36, and an exhaust port 32 that is connected to a vacuum pump. The walls of the reaction chamber 31 and the base plate 38 form the grounded anode of the system. Gas supply 33 is communicated into the chamber 31 through port 34 and conduit 35 to a gas distribution ring 41 at the top of the chamber.

The parallel plate plasma system 10 is a relatively high pressure system, operating in the pressure range of 100 millitorr to several torr, and thus involves a substantial flow rate of reactive gases into the system. In contrast, the reactive ion etching systems 20 and 30 are operated at low pressures in the range of 1 to 100 millitorr and, thus, use substantially lower gas flow rates. In the reactive ion etching systems 20 and 30, activated ion species in the neighborhood of the cathode have high inherent directionality normal to the cathode and the wafers mounted thereon. By using high frequency RF energy at fairly substantial power levels, the etch rates are increased in systems 20 and 30, despite the relatively low concentration of activated species, because the momentum of the ions bombarding exposed material regions on the wafer surface enhances the chemical reaction between the activated species and the material to be etched. Also, the highly directional mechanical ion bombardment etch component dominates the more isotropic chemical component and imparts high anisotropy to the etching characteristics of the system. Consequently, RIE mode systems such as 20 are preferred for etching very small features such as grooves and trenches in VLSI and ULSI circuits.

The following are important factors and requirements in the design and selection of commercially useful RIE mode etching reactors. First, to provide acceptable device manufacturing yields, the RIE mode reactor must meet certain process requirements such as directionality, selectivity, uniformity, throughput, low particulate levels, etc. Secondly, it is desirable that the RIE mode etch reactor require little or no maintenance, for example, by incorporating in-situ, self-cleaning capability. Other desirable characteristics include the adaptability to factory and reactor automation, small reactor size and low manufacturing cost.

The latter group of factors would tend to favor the use of single wafer systems over batch-type systems, other factors being equal. Moreover, single wafer systems are more convenient for process development (only one expensive wafer is used for each process run) and do not present within-batch, wafer-to-wafer uniformity problems.

However, the single wafer RIE systems typically must be operated at high pressures (>200 mT) in both the plasma mode and in the RIE mode, to increase the etch rate and throughput. Unfortunately, high pressure operation decreases directionality and selectivity and makes it difficult to meet the exacting requirements of VLSI and ULSI device manufacturing. Thus, as is usually true, other things are not equal and in order to obtain commercially viable high throughput as well as acceptable directionality and selectivity characteristics, most RIE mode etchers, including etchers 20 and 30 shown in FIGS. 2 and 3, are low pressure batch-type reactors.

Referring to FIG. 4, there is shown a single wafer RIE mode etch reactor 40 which is an exception to the above-described state of the art. The magnetic field-enhanced, RIE mode plasma etching system 40 is that described in co-pending, commonly assigned U.S. Pat. No. 4,668,338, entitled "Magnetron-Enhanced Plasma Etching Process", issued May 26, 1987, in the name of inventors Dan Maydan et al. The system 40 is a modification of the magnetic field-enhanced CVD deposition system disclosed in co-pending, commonly assigned U.S. Pat. No. 4,668,365, entitled "Apparatus and Method for Magnetron-Enhance Plasma-Assisted Chemical Vapor Deposition", also issued May 26, 1987, in the name of inventors Foster et al. The U.S. Pat. Nos. 4,668,338 and 4,668,365 are hereby incorporated by reference. The RIE mode etch reactor 40 uses magnetic field-enhanced etching to provide a relatively high etch rate despite the use of relatively low pressure and, therefore, can provide high throughput without sacrificing directionality and selectivity, or vice versa. The RIE mode etch reactor 40 also decreases the inherent etch non-uniformity which results from interaction between the magnetic field and the plasma in magnetic-field enhanced RIE systems.

The system 40 includes a cylindrical stainless steel vacuum chamber 43. A flanged cathode assembly 42 is mounted within the chamber 43 on insulating posts (not shown). Typically, the cathode 42 is polygonal and has non-magnetic reflector end sections 44A (FIG. 5) formed of conductive non-magnetic material such as aluminum. Outer end sections 44B are formed of material such as Maycor ® insulating material. Power is supplied for plasma operation by an RF system 46, typically a 13.6 MHz system, that includes an RF power supply and a load matching network and is connected to the cathode 42. Reactant gas is communicated to the interior of chamber 43 by one or more inlet tubes or ring manifolds 47 from a gas supply system 48, of gas storage tanks/reservoirs 49—49.

Semiconductor wafers 55 are held by means 51, such as posts or clips, at the side of the cathode. As indicated by arrows 52, the reactant gas flows across the substrate surface, and then via one or more exhaust outlets 53 to a mechanical pump (not shown) via a vacuum valve and Roots blower.

Electromagnets 54 and 56, typically formed of copper coils, are circumferentially positioned about the chamber 43 near the top and bottom thereof. The electromagnets form north and south poles which are reversible by reversing the coil current.

Referring further to FIG. 4, during RIE mode plasma etching operation of the reactor system 40, a selected etching gas or mixture is inlet from the gas supply through the inlet tubes 52—52 to the reaction chamber 43, which is evacuated by the exhaust pump system. As shown in FIG. 5, application of RF power from the power supply 46 creates a low pressure, reactant gas discharge or plasma 57 of electrons, ions and disassociated species in the vicinity of the semiconductor wafers 55. An electric field E is formed across the plasma shield or dark space directed from the positive potential etching plasma toward the surface 58 of the electrode central section. This field accelerates electrons across the sheath away from the electrode surface and accelerates positive ions across the sheath toward the electrode and the wafer 55 to provide the directional ion bombardment etch component which is characteristic of RIE mode plasma etching.

The reversible magnetic field, B, FIG. 5, is applied to the chamber 43 parallel to the substrates 55 and perpendicular to the electric field, E, to control the characteristics of the etch process. The electrons are confined by the magnetic field lines, which prevent the electrons from moving easily from the cathode face 58 to the anode 43. Also, the magnetic and electric fields impart an $E \times B$ drift velocity to the electrons so that they tend to drift and to move from point to point along the cathode surface. The electrons are concentrated in a band having a net drift velocity along the cathode and substrate. In conjunction with the end reflectors 44A, the $E \times B$ drift velocity tends to confine the electrons within the plasma.

As mentioned, there is an inherent uniformity problem due to with the interaction between the magnetic field and the plasma in magnetic-field enhanced reactors. The plasma density is higher downstream in the $E \times B$ direction, providing a higher etch rate. To illustrate, and referring to the FIG. 5 enlarged partial cross-sectional view of the cathode 42 of etcher 40, FIG. 4, the etching rate is greater at the end or side 58 of the wafer corresponding to the positive side of the magnetic field. Reversing the current through the two cylindrical coils 54 and 56 (FIG. 4) reverses the direction of the magnetic field across the wafer, to B'. This reverses the plasma flow so that the higher etching rate is switched to the opposite end 59 of the wafer. By reversing the magnetic field, the inherent etching non-uniformity is partially compensated in that the etch rate and total etching are averaged across the wafer along the direction of the static field.

Other magnetic field-enhanced RIE etchers attempt to minimize the etch non-uniformity using different techniques. For example, one approach mounts permanent magnets beneath the wafer to provide the magnetic field and mechanically moves these magnets to "smear" the field. This approach does not really solve the non-uniformity problem, has potential mechanical problems and does not provide an adjustable magnetic field strength. A second approach known to us also uses fixed permanent magnets to generate the magnetic field and uses very low pressures to minimize non-uniformity.

To summarize the state of the art, presently, batch-type reactors such as those 10, 20 and 30 described above are used in most commercial plasma etching and RIE mode plasma etching reactors. The batch reactors process a relatively large number of wafers at once and, thus, provide relatively high throughput. However, single-wafer reactors have certain advantages, described above, such as their adaptability to automation, small size, low manufacturing cost, and their lack of wafer-to-wafer within-batch uniformity problems, which make such reactors attractive, particularly for etching large, expensive wafers such as 6 inch and 8 inch diameter wafers. Unfortunately, in the past, inter-related problems with etch rates, throughput, directionality/selectivity and within-wafer uniformity have prevented full utilization of the potential advantages of single wafer etches.

SUMMARY OF THE INVENTION

OBJECTS

It is one object of the present invention to provide a single wafer etch reactor which provides both high etch rates and high etch uniformity, in addition to meeting the other process requirements.

It is a further object of the present invention to provide such an etch reactor which incorporates in-situ self-cleaning capability.

It is also an object to provide such a reactor which incorporates automated internal wafer handling capability and is readily interfaced with external wafer exchange robots.

These objects are exemplary, not exhaustive. Others will be evident from the disclosure.

SUMMARY

The above objectives are achieved in an etch reactor which in one aspect embodies a housing defining a vacuum chamber adapted for processing a wafer comprising: an electrode assembly having a convex surface supporting a wafer in a bowed configuration parallel to the electrode surface; a gas distribution system including a gas manifold positioned closely adjacent to the electrode surface for supplying reactive gas to the chamber; means for applying RF energy to the chamber to generate a reactive etching gas plasma from the reactive gas between the electrode and the manifold; and means for applying an electrically-controlled D.C. magnetic field parallel to the wafer-support surface of the electrode, selectively varied as to magnitude and direction for providing uniform etching over a wafer positioned on the electrode.

Preferably, the magnetic field is provided by two or more pairs of electromagnets located on opposite sides of the chamber for providing separate magnetic fields across the wafer and, computer means for controlling the current in the individual electromagnets to independently control the magnitude and angular orientation of the resultant magnetic field vector. In particular, both the magnitude and/or direction of the magnetic field provided by this paired electromagnet configuration can be changed instantaneously. The field can be stepped about the wafer at a slow rate of a few cycles per minute to provide uniform etching at high pressures without eddy current loss.

In another aspect, gas is applied between the wafer and the electrode at pressure greater than the chamber pressure to increase uniform thermal conduction from the wafer to the electrode, which, preferably, is liquid cooled. Clamping means is provided for resiliently clamping the wafer to the electrode. Protective coatings or covers of material, such as, for example, quartz, may be provided on the clamp ring and gas manifold. The wafer support surface of the electrode has a dome-shaped or convex curvature. As a result, when this wafer is clamped to the electrode, the wafer is bent into the domed surface configuration of the electrode and closely parallels the surface of the electrode. This controlled parallel close spacing between the bowed wafer and electrode is mantained when the heat transfer gas is applied between the wafer and the electrode. This enables uniform heat transfer across the entire surface of the wafer to the electrode and, consequently, uniform processing characteristics such as etch rate across the wafer. This gas-enhanced liquid electrode cooling permits the use of very high power densities, for the purpose of increasing etch rate and plasma control, while maintaining the wafer at a relatively low temperature to facilitate profile control and avoidance of phenomenon such as black silicon.

Wafer exchange means comprising a group of movable pins extending through bores in the electrode assembly is used to position the wafer on the electrode assembly and remove the wafer.

The reactor also comprises a feed-through device for coupling the electrode heat transfer cooling gas at low pressure to the RF-powered electrode assembly without breakdown. The feed-through device comprises a housing having a gas inlet adapted for receiving the cooling gas and a spaced gas outlet connected to the electrode. The housing further includes a pair of internal, closely spaced apertured plates transversely spanning the path of the gas, the plate on the outlet side of the gas flow being connected electrically in common with the pedestal and the inlet side plate being connected to system ground.

In another aspect, heating means such as an electrical resistance heating unit is mounted on the housing for providing controlled heating of the inner chamber walls to prevent formation of wall deposits.

This combination of features including the electrically-controlled multi-directional magnetic field, the temperature control of the cathode and reactor walls and the use of protective materials such as the quartz covers enables satisfaction of the above-identified design objectives. The various and conflicting process requirements such as directionality, selectivity and uniformity are met over a range of pressures, including high pressures in a low maintenance in-situ self-cleaned single wafer system. In particular, the electrically-controlled multi-directional field and the use of special protective materials provide high directionality, high selectivity and high uniformity during operation. The electrically-controlled multi-directional field provides uniform etching over a very broad pressure range of about 0.001 to 0.300 torr, which includes high pressures, thereby permitting high rate etching without sacrificing uniformity. This broad pressure range permits in-situ self-cleaning. The temperature controlled surfaces and electrically-controlled multi-directional magnetic field facilitate clean operation and in-situ cleaning. The electrically-controlled multi-directional field independently increases the etch rate and, in combination with the high pressure operation capability, provides a throughput-practical single wafer etcher.

BRIEF DESCRIPTION OF THE DRAWINGS

The above and other aspects and advantages of the present invention are described in conjunction with the following drawing figures, in which:

FIGS. 1-3 schematically depict three types of plasma etching systems which are available in the art;

FIG. 4 is a perspective view, partially in schematic form, of a magnetically-enhanced RIE mode plasma etch system that is a progenitor of the magnetically-enhanced RIE mode plasma etch system of the present invention;

FIG. 5 is a vertical cross-section, partly in schematic, through the wafer-holding electrode of the chamber shown in FIG. 4, illustrating B reversal;

FIG. 6 is an isometric view, partially cut away, of a preferred embodiment of the magnetic field-enhanced plasma reactor of the present invention;

FIGS. 8-10 are sequential, schematized representations of the operation of the wafer exchange system in positioning wafers on, and removing wafers from the reactor pedestal;

FIG. 11 depicts an enlarged, vertical cross-section of the gas feed-through system shown in FIG. 7;

DETAILED DESCRIPTION OF THE INVENTION

Overview of Magnetron Etch Reactor 60

Figure 7:
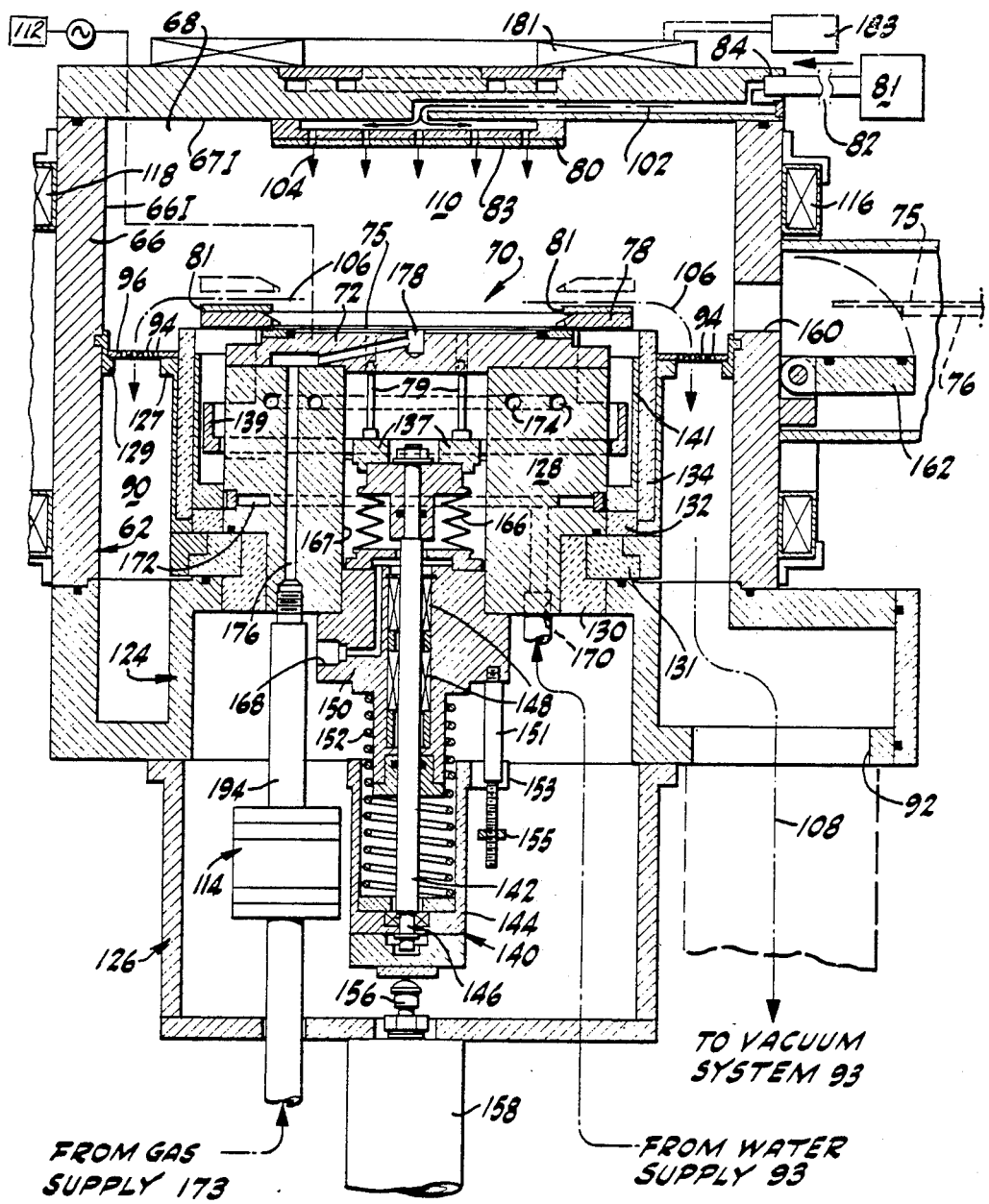
FIG. 7 is a vertical cross-section, partly in schematic, taken along lines 7—7 in FIG. 6.

FIGS. 6 and 7 depict, respectively, an isometric view of the preferred embodiment of the single wafer, magnetic field-enhanced plasma etch reactor 60 of our present invention, and a vertical cross-section through the reactor 60. The description here is directed primarily to RIE mode plasma etching, but the reactor capability extends to plasma mode etching as well.

Referring to FIGS. 6 and 7, the etch reactor system 60 of our present invention comprises a housing 62, typically of non-magnetic material such as aluminum, which has an octagonal configuration of outer walls 64 (as viewed in horizontal cross-section). Circular inner wall 66 defines etch chamber 68. As described more fully subsequently, the reactor system 60 also includes a unique gas- and liquid-cooled pedestal/cathode assembly 70 and a wafer exchange system 74 (FIGS. 8–10).

The wafer exchange system 74 includes vertically movable wafer lift fingers 79 which pick up a wafer 75 from an external manually held or operated blade 76 which is inserted into the chamber or, preferably, from an external load lock robot blade 76, and transfer the wafer to the cathode 72 for processing, then return the processed wafer to the robot blade for removal from the chamber.

In addition, the wafer exchange system 74 integrally incorporates a wafer clamp ring 78 with the wafer lift fingers 79. As described in detail below, the design of the wafer exchange system 74 and the incorporation of the associated wafer lift and clamping structures permit the use of a one-axis robotic drive within the chamber. Furthermore, the operation of the chamber robot requires that the external robot merely present the wafer to a selected transfer position for exchange with the chamber robot.

Simplifying the demands on the external robot makes possible a relatively simple robot, even when the robot is used in a multi-chamber load lock system that serves a multiplicity of reactors. Such a robot, which uses R-$\theta$ movement, is disclosed in co-pending commonly assigned U.S. patent application Ser. No. 944,803, entitled "Multiple Chamber Integrated Process System", concurrently filed, in the name of Dan Maydan, Sasson Somekh, David N. K. Wang, David Cheng, Masato Toshima, Isaac Harai and Peter Hoppe, which patent application is incorporated by reference in its entirety (also called "referenced multi-chamber system").

Process gases are supplied to the interior of the chamber 68 by a gas manifold 80 from a gas supply system 81 comprising one or more gas storage reservoir/tanks. The gas supply system 81 communicates to the manifold 80 and chamber 68 via supply line(s) 82, which is coupled into the manifold 80 by inlet connection 84. The system includes an automatic flow control system or other suitable control system which controls the flow rates of the various etchant gases, carrier gases, etc., supplied to the chamber 68.

Vacuum is supplied to the chamber and spent gases and entrained products are exhausted via annular exhaust chamber 90 communicating to exhaust port 92 which, in turn, is connected to a conventional vacuum pumping system 93. The exhaust flow is directed from the chamber 68 through holes 94 in a horizontal annular plate 96 mounted about the upper periphery of the cylindrical cathode assembly 70. The apertured plate 96 inhibits plasma penetration into the annular exhaust chamber 90. This exhaust arrangement facilitates uniform coverage and etching of wafer 75 by the reactant gas. Control of the exhaust system can be by a capacitive conventional system such as manometer sensor (not shown) which operates through a pressure control system and D.C. motor to control the speed of the blower, or by other conventional control systems.

As indicated by the arrows 102, 104, 106, 108 in FIG. 7, the gas communicated to inlet 84 (arrow 100) is routed into the manifold 80 (arrow 102) and is then directed downwardly from the manifold (arrow 104), forming an etching gas plasma in chamber process region 110 during application of RF power, then flows over the wafer 75 and radially outwardly across the wafer and into the annular exhaust chamber (arrow 106), then out the exhaust port 92 (arrow 108).

The above-mentioned RF power is supplied by an RF supply system 112 to the reactor system 60 for plasma operation, i.e., to create an etching gas plasma from the inlet gases in process region 110. This system 112 includes an RF power supply and a load matching network, and is connected to the pedestal 72, with the chamber walls being at ground. That is, the pedestal is the powered cathode. The RF power typically is supplied at a high frequency, preferably about 13.6 MHz. However, the reactor system 60 can be operated at low frequencies of, for example, several kHz.

The use of a powered pedestal cathode 72 has the advantage of concentrating the RF power and plasma on the surface area of the wafer and increasing the power density across the wafer while reducing it everywhere else. This ensures that etching takes place on the wafer only, reducing erosion in other parts of the chamber and thus reducing possible wafer contamination. Typically, power densities of about 2.5–3.5 watts/cm$^2$ are and can be used. As discussed below, these high power densities require cooling. Preferably, the RF-powered cathode 72 is constructed to combine gas-enhanced wafer-to-cathode thermal conductance and liquid cathode cooling. However, the application of cooling gas such as helium to the powered pedestal 72 at low pressure would ordinarily cause the cooling gas to break down. The present reactor includes a unique gas feed-through 114, FIG. 7, that supplies the gas to the high voltage electrode without ionization.

Reactor 60 also comprises an improvement of the magnetic field-generating system disclosed in FIG. 4 above. Referring to FIG. 6, the system can use a number of paired electromagnets such as the four electromagnets 116, 118, 120 and 122, typically comprising copper coils, mounted in a rectangular array, one each on alternating walls of the octagon-shaped housing. The two coil pairs cooperatively provide a quasi-static, multi-directional field which can be stepped or rotated about the wafer to provide etch uniformity at high and low pressures. Also, the magnitude of the field can be varied to select etch rate and decrease ion bombardment.

Electrically-Controlled Multi-Directional Magnetic Field Generator

Figure 12:
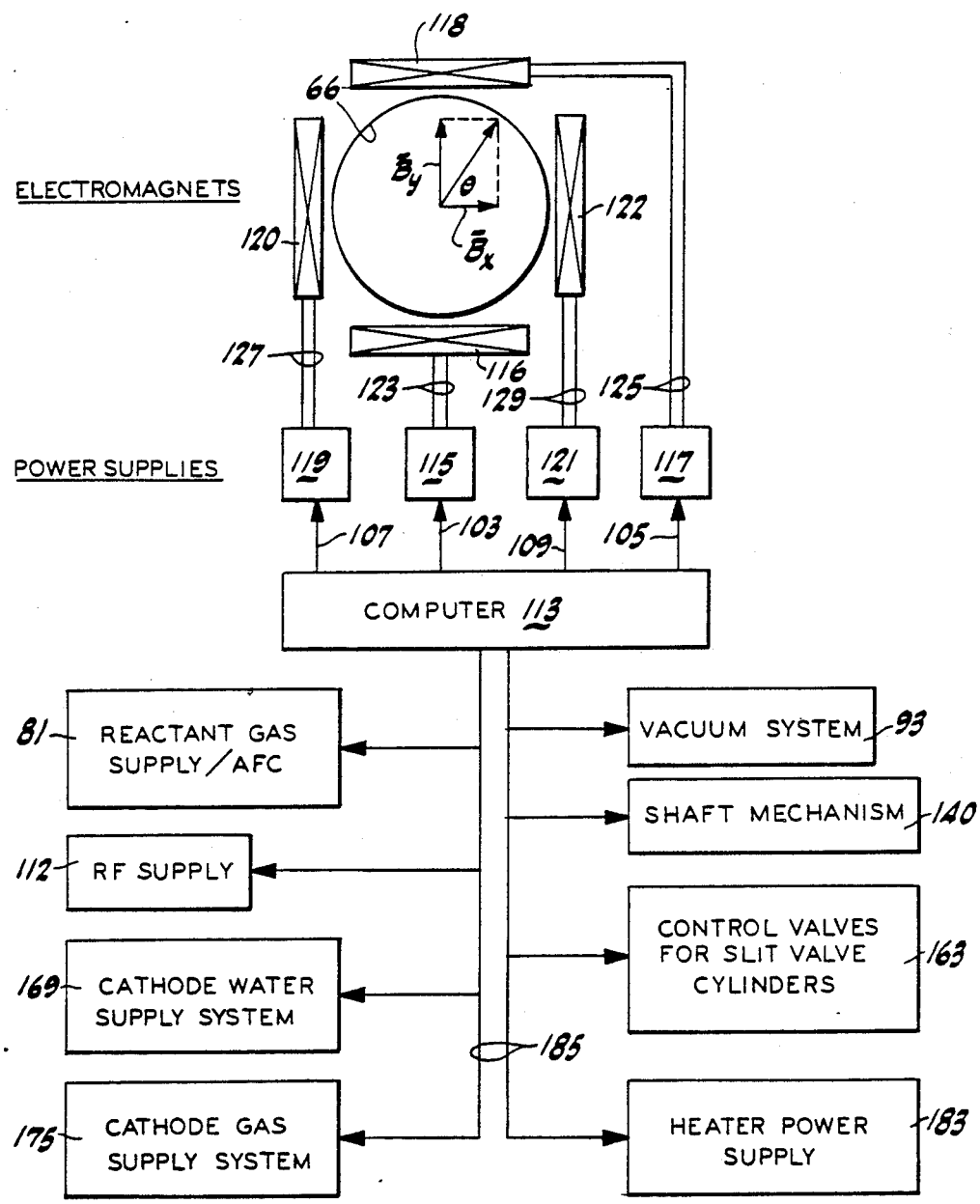
FIG. 12 is a schematic representation of the system for generating and controlling the electrically-controlled, quasi-static, multi-directional D.C. magnetic field used in the present invention and a computer system suitable for controlling overall operation of the present reactor.

FIG. 12 is a schematic representation of the system for generating and controlling the quasi-static, multi-directional magnetic field used in the present invention.

Referring primarily to FIG. 12 in addition to FIG. 6, the two coil pairs 116,118 and 120,122 form mutually perpendicular magnetic field vectors $B_y$ and $B_x$, respectively, which are generally parallel to the pedestal/cathode 72 and the wafer 75. In the exemplary illustration shown in FIG. 12, computer 113 applies control signals via lines 103, 105, 107 and 109 to conventional power supply systems 115, 117, 119 and 121 to control the magnitude and direction of the currents supplied over conductors 123, 125, 127 and 129, respectively, to the electromagnets 116, 118, 120 and 122. The associated current determines the direction and magnitude of the field generated by each coil pair.

The perpendicular field vectors $B_y$ and $B_x$ generated respectively by coil pairs 116,118 and 120,122 are defined by $$B_x = B \cos \theta \tag{1}$$

$$B_y = B \sin \theta \tag{2}$$

Given the desired or required values of the field, B, and its angular orientation $\theta$, the computer 113 can independently solve equations (1) and (2) to obtain the associated magnetic field vectors $B_x$ and $B_y$ which provide the desired strength of field and orientation and then control application of the necessary electric currents in the coils 116-122 to provide these fields $B_y$ and $B_x$.

Moreover, the angular orientation and magnitude of this DC magnetic field can be independently altered as quickly or as slowly as desired by changing the current in the coils. The time that the field is on at each angular position and the direction of angular stepping may be varied as well as the field intensity, since these parameters are solely a function of changing the currents to the electromagnets and are readily controlled by computer 113. Thus, the field can be stepped around the wafer using selected orientation and time increments. If desired, the magnitude of the resultant field $B_\theta$ can be changed as the process or reactor configuration may require, or a constant field strength can be used. In short, the electrical current-controlled system provides the versatility of a fast or slow moving, constant or varying strength magnetic field of constant or varied angular velocity. In addition, the orientation of the field need not be stepped or changed sequentially, but can be instantaneously switched from any given orientation (or field strength) to another.

This versatility in independently controlling the direction and magnitude of the D.C. magnetic field is distinct from existing commercially useful rotating magnetic fields, which typically rotate at a fixed relatively high frequency such as the standard rate of 60 Hertz. In addition, the ability to "rotate" slowly, at a rate, for example, as low as 2 to 5 sec./revolution (12 to 30 cycles/min.) or slower avoids problems such as the eddy current losses associated with the use of higher frequencies in aluminum or metal chambers.

The previous reactor 40, FIG. 4, reverses the static magnetic field along one axis. In contrast, reactor 60 effectively rotates the magnetic field, preferably at the slow rate of, e.g., 2 to 5 sec./revolution, by the simple expedient of sequentially changing the currents to the electromagnet coils. This steps the magnetic field about the wafer at a slow rate and increases etch uniformity 360° around the wafer, rather than in one direction across the wafer. As a result, the reactor 60 can be used over a wide range of low-to-high pressures with directionality, selectivity and uniformity that exceed those of even low pressure RIE etchers.

One application of the preferred low rate magnetic field rotation of, for example, 2 to 30 cycles per minute is described in the below-referenced hydrogen bromide/hydrogen iodide etch process. Specifically, the use of the magnetic field in combination with the brominate and iodinate etch chemistries controls the etch and reduces wafer damage. Increasing the magnetic field increases the etch rate and, thus, a given etch rate can be obtained by increasing the magnetic field and decreasing the RF power and the resulting bias voltage $-V_{dc}$. This reduces ion bombardment of the wafer and device damage. The bromine and iodine etching gas compositions used in the referenced bromine/iodine silicon etch process are carefully formulated to form inorganic sidewall deposits on the trench sidewalls as the silicon material is being etched and thereby control the sidewall profile. Increasing the magnetic field increases the effectiveness of this etch profile control.

Generally, as the magnetic field strength is increased, the protective sidewall deposit is thickened (when an oxygen source is present), providing greater taper and less bowing to the trench profile. Since one can change the magnetic field readily, this gives the ability to vary the profile with increasing depth. For example, in very narrow deep trenches it may be desirable to have a wider trench mouth to facilitate subsequent filling of the trench with dielectric. The taper control provided by adjusting the magnetic field permits just such a funnel shaped, wide mouth, narrow bodied trench.

FIG. 12 described above also depicts schematically the overall computer control system for reactor 60. Presently, controller 113 uses a 68010-type processor.

In addition to controlling application of current to the electromagnets 116-122, the computer 113 also controls the gas flow from supply 81, application of RF power from supply 112, inlet of cooling gas and water to the cathode from respective supplies 169 and 175, vacuum system 93, control valves for the pneumatic cylinder for the shaft mechanism 140, control valves for the pneumatic cylinders 163 for the slit valves 162, and the water heater power supply 183.

Pedestal Assembly 70

Referring to FIG. 6 and primarily to FIG. 7, the pedestal assembly 70 comprises a generally cylindrical wall structure 124 that is mounted inside the housing 62, and a cylindrical bottom housing 126 that is mounted to, and extends below, the bottom of housing 62. The annular exhaust plate 96 is mounted peripherally about the housing 124 on bosses 127 and 129. The powered pedestal/cathode 72 is mounted on a generally cylindrical base member 128 that is mounted to the grounded housing by mating annular insulator members 130-134.

The integral wafer exchange assembly 70 includes a multiplicity of the vertically-extending wafer support pins/fingers 79—79 (four are illustrated) arranged in a circular configuration. The fingers 79 extend through holes in the periphery of the pedestal 72 and base 128. Both the wafer support fingers 79—79 and the wafer clamping ring 78 are mounted to a support arm means, which comprises horizontally-extending arms 137—137 mounted to shaft lift mechanism 140 and cylindrical ring member 139. The arms 137—137 are mounted to the shaft lift mechanism 140 for vertical displacement, discussed below.

As mentioned, the vertically oriented wafer holding pins 79—79 are mounted on respective arms 137—137 of the arm assembly and extend through holes in the upper, wafer support face of the pedestal 72. Wafer clamp ring 78 is also mounted to the arm assembly, that is, to the ring 139. The ring 139 is vertically movable within a channel 141 formed between housing 124 and base 128. As discussed at length below regarding FIGS.

8-11, the use of the wafer support pins 79 and the wafer clamping ring 78, which is displaced vertically from the pins, and their joint mounting to the common, vertically movable arm assembly provide simple wafer exchange with an external robot blade 76 using a single axis movement.

The shaft assembly 140 comprises a sleeve 142 and a cylindrical spring retainer 144 that are joined by bolt 146, and is slidably mounted on bearings 148 within a bore formed in base 150. The base 150 is of stepped cylindrical configuration, and is joined at the step or shoulder thereof to the bottom of base 128.

Lateral movement of the shaft lift mechanism is controlled, i.e., prevented, by a pair of vertical guide pins 151 (only one is shown) which extend through an eyelet 153 of the shaft 140. An adjustable stop nut 155 is mounted on the threaded lower portion of pin 151 to limit the upward movement (uppermost position) of the shaft mechanism 140 and the associated clamp ring 78 and pins 79.

A spring 152 is secured between the bottom of the base 150 and the shaft's spring retainer 144 to bias the shaft 140, clamp 78 and pins 79 downwardly to a normal, lower position. As shown in FIG. 7, in this spring-biased position, the pins 79—79 are retracted into their holes in the pedestal 72 and the clamp ring 78 resiliently engages the periphery of the pedestal 72. If a wafer 75 is positioned on the pedestal, the clamp ring 78 securely and resiliently clamps the periphery of the wafer against the pedestal's upper surface 154 (FIG. 8). Vertical upward movement of the shaft 140, clamp ring 78 and pins 79—79 is effected by the vertical rod 156 of a pneumatic cylinder 158 which, typically, is mounted to housing 126 and is operated under control of computer 113 (FIG. 12). Upward movement of the rod 156 moves the shaft 140 upward against the biasing action of the spring 152, disengaging the clamp ring 78 from the pedestal 72/wafer 75 and extending the fingers 79—79 upward through the pedestal to pick up a wafer.

Operation of Wafer Exchange System 74

FIGS. 8-10 illustrate operation of the unique, unitary clamp 78/finger 79 wafer exchange system 74. The resulting simple, one-axis robot movement transfers individual wafers 75 from the external blade 76 (see also FIG. 6) to the pedestal/electrode 72 and vice versa, and clamps the wafer on the pedestal to securely position the wafer and to also facilitate cooling the wafer, as described below.

Referring to FIGS. 6, 7 and 8, the reactor housing wall 66 has a closable elongated opening or slot 160 which allows movement of the external blade 76 in and out of the chamber. The slot 160 is closed by a pivotally mounted valve or door 162 to seal the chamber when the blade 76 is not being used to deposit/withdraw wafers from the chamber. The door 162 is opened and closed by a pneumatic cylinder system 163 (FIG. 12). Clamp support ring 139 has a pair of recesses 164—164 (FIG. 6) formed in upper opposite sides thereof that permit insertion of the blade 76 and wafer 75. A simple bidirectional, one-axis robot-type blade 76 is all that is required to transfer the wafers between the reactor chamber 60 and external storage such as a cassette. A suitable robotic blade and door are described in the above-referenced multi-chamber system.

Initially, the clamp- and finger-mounting arm assembly is positioned in the slightly elevated position shown in FIG. 8 and in phantom in FIGS. 6, so that the ring's recesses 164, the housing slot 160 and the blade 76 are aligned horizontally. This permits insertion of the blade 76 through the front recess 164. Please note, the separation between the top of the pins 79 and the clamping ring 78 is aligned horizontally with the recesses 164. Thus, the blade 76 can also pass between the pins 79—79 and the clamping ring 78. With the slots 160 and 164 so aligned, the blade 76 (with a wafer 75 to be processed supported thereon) is inserted via the opening 160 and recess 164 into the chamber 68 and the plasma etching region 110 and over the pedestal 72.

Next, as shown in FIG. 9, the rod 156 (FIG. 7) is extended to raise the shaft lift mechanism 140 and wafer-support pins 79—79 to lift the wafer 75 from the blade 76.

After retraction of the blade 76, door 162 is closed. Referring to FIG. 10, cylinder 158 (FIG. 7) then retracts rod 156 so that the spring 152 lowers/retracts the shaft 140, and the clamping ring 78 resiliently clamps the wafer 75 between the ring and the pedestal 72.

After processing, the cylinder 158 raises the shaft lift mechanism 140 to lift the wafer 75 above the blade 76 so the blade can be inserted into the chamber beneath the wafer. The shaft 140 is then lowered slightly to position the pins 79—79 and clamp 138 in the position shown in FIG. 8. At this point, the blade 76 which holds the processed wafer 75, is retracted from the chamber. A fresh wafer can be placed on the blade 76 and inserted into the chamber between the clamp 78 and pins 79—79, as shown also in FIG. 8, to initiate the start of another wafer exchange cycle.

As described above, the wafer exchange system 74 transfers wafers to and from the blade, clamps the wafers and removes the wafer from the pedestal using only perpendicular, point and peripheral contact. The usual sliding and/or rolling friction contact is required to pick up and deposit wafers is absent. As will be appreciated, this reduces the tendency to generate particulates within the processing chamber 68.

In addition, the support and translation apparatus for the single axis robot is positioned beneath the chamber 68 and is isolated from the chamber by the surrounding pedestal assembly 70. Bellows 166 is mounted between the upper end of the shaft assembly 140 and the base 150 to provide an additional barrier between the shaft 140 and the wafer 98 and processing chamber 68. The interior of the bellows 166 is vented by orifice 168 to the atmospheric pressure ambient within the housing 126. This facilitates expansion and contraction of the bellows along the shaft axis during raising and lowering thereof in the atmospheric ambient of the shaft chamber 167.

Wafer Cooling System

Referring primarily to FIG. 7, as mentioned, the electrode/pedestal assembly 70 is cooled by a combination of liquid and gas, i.e., by gas-enhanced wafer-to-cathode thermal conductance and by liquid cathode cooling. Liquid, typically in the form of cold water is applied by the computer 113-controlled valve and pumping system 169 (FIG. 12) to an inlet 170 which communicates with a lower annular channel 172 in the base 128 and also with a pair of upper circular channels 174—174. That is, the cooling water flows into the inlet 170, and then passes through the lower channel 172 and the upper channels 174—174 to an outlet (not shown). The hole pair 174—174 is used instead of a wider single channel to bypass the cooling gas inlet passageway 176.

The cooling gas is used to enhance heat transfer from the clamped wafer 75 to the water-cooled pedestal 72. The thermally conductive gas is applied by conventional computer 113-controlled valve system 175 (FIG. 12) to inlet passageway 176 via feed-through 114, discussed below, which prevents ionization of the low pressure gas by the driven pedestal. Referring also to FIG. 6, the passageway 176 connects to an orifice 178 that intersects radial grooves 180 in the face of the pedestal 72.

Figure 13A:
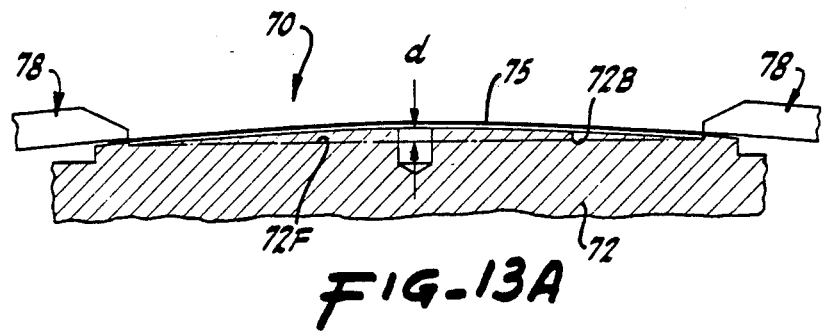
FIGS. 13A-13C schematically depict the clamped mounting of the wafer to the convex or dome-shaped wafer support pedestal.
Figure 13B:
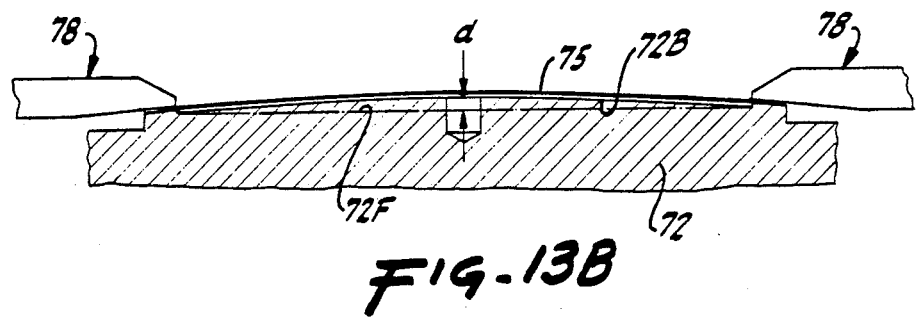
Figure 13C:
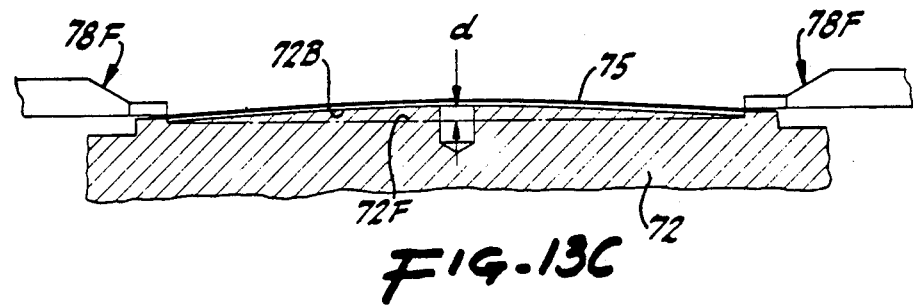

As mentioned, the cathode assembly 70 has a dome-shaped upper surface which compensates for the inherent tendency of the cooling gas to bow the wafer relative to the cathode. FIG. 13 is a schematized vertical cross-sectional view of the pedestal 72, wafer clamp ring 78 and clamped wafer 75 showing in an exaggerated manner the curved or domed configuration of the upper surface of the pedestal 72. Clamp ring 78 may clamp the upper surface of the wafer 15 against the pedestal 72 or, preferably, may include a number of radial fingers 78F which clamp the upper surface of the wafer. The periphery of the pedestal 72 may be tilted as part of the overall convex shape thereof and the lower surface of the clamp ring 78 or the fingers 78F may have a mating tilted orientation. Alternatively, the clamp/fingers and the periphery of the pedestal can be oriented horizontally.

Using this pre-stressed, convex or bowed wafer orientation, the wafer is parallel to the surface of the pedestal 72, i.e., there is a substantially constant distance between the pedestal and wafer. This parallelism is maintained even when the cooling gas is applied at relatively high pressures such as 1–10 torr between the pedestal and wafer. Please note, for four to eight inch wafer diameters (and pedestal diameters which are also approximately four to eight inches), we have found that a curvature in which the center of the pedestal is bowed out a distance, d, of four to eight mils pre-stresses the wafer to a parallel bowed configuration which is maintained when the cooling gas is applied. That is, convex pedestal surface 72B is bowed out a distance of four to eight mils relative to a conventional flat electrode 72F. While the curvature is small, it is an important factor in achieving uniform wafer cooling and uniform wafer processing.

In operation, with the wafer 75 clamped against the electrode 72 by ring 78, helium or other suitable gas that is a good heat conductor at low pressure, is applied via feed-through 114 and inlet 176 to the radial grooves 180—180 at the interface between the wafer and the pedestal to establish a nearly static gas pressure of, typically, about 1 torr to 10 torr, which is much higher than the chamber pressure. During plasma operation of the reactor 60, this interface gas uniformity transfers heat from the pre-bowed wafer 75 to the parallel water-cooled pedestal 72, thereby enabling uniform cooling of the wafer by the liquid-cooled cathode assembly 70.

The importance of the RF-driven, high power density, gas and liquid cooled cathode assembly 70 is illustrated in commonly assigned, co-pending U.S. patent application Ser. No. 944,491, entitled "Bromine and Iodine Etch Process for Silicon and Silicides", concurrently filed herewith, in the name of Jerry Y. Wong, David N. K. Wang, Mei Chang, Alfred Mak and Dan Maydan (also called the bromine/iodine etch process), which patent application is incorporated in reference in its entirety. In implementing the referenced bromine/iodine etch process, the wafer supporting cathode assembly 70 is cooled by water of about 20°–30° C. Gas such as helium is applied between the wafer and the water-cooled cathode 72 at a substantially static pressure of about 4 torr. This provides high rate uniform thermal conductivity between the wafer 75 and the cooled cathode 72 to thereby maintain the surface of the pre-stressed, bowed wafer at a uniform temperature at about 60° C. or lower. This cooling is required because the high power density of about 2.5–3.5 watts/cm$^2$ is approximately one order of magnitude higher than the power densities used in conventional RIE etchers. The cooling helps to eliminate bowed trench profiles and black silicon during the use of the referenced bromine/iodine etch process or other processes to etch silicon and other materials and, otherwise facilitates profile control. The black silicon phenomenon may occur at temperatures as low as about 70° C.

Chamber Surface Temperature Control

Referring to FIG. 7, a heating unit 181, typically a cylindrical electrical resistance heater or other suitable unit, is mounted on the cover 67 of reactor 60 for the purpose of heating the cover 67 and the upper portion of the housing sidewalls 66—66 corresponding to the chamber 68 and, specifically, the inside housing and upper chamber walls 67I and 66I. Referring also to FIG. 13, power is supplied to the heater 181 by a power supply 183, which is controlled by the computer 113 via control line 185. The electromagnets 116 through 122 provide supplementary heating of the walls 66—66.

Preferably, the heater 181 is selectively operated as required to heat the walls 67I and 66I as well as the inner surface of the gas box 80 to prevent condensation during reactor operation. For example, the profile-control inorganic sidewall deposits formed by the bromine and iodine etching gas compositions used in the referenced bromine/iodine silicon etch process may comprise various combinations of constituents such as silicon, oxygen, bromine and/or fluorine, such as $SiO_2$, $SiBr_x$, $SiBr_xF_y$ and $SiOBr_xF_y$. During this etch sequence, the computer 113-controlled heater 181 heats the wall 67I and 66I to a temperature >70° C. to prevent unwanted condensation of these inorganic deposits.

Quartz Encapsulation

Typically, the clamp ring 78 is formed of a lightweight resilient material such as Ardel or Lexan to facilitate movement and to resiliently clamp the periphery of the wafer without damage. Also, the gas box 80 and the rest of the chamber are formed of a non-magnetic material such as aluminum. We have found that providing a quartz coating or layer 81 about ⅛ in. thick over the clamping ring 79 and a similar quartz layer or coating 83 about ⅛ in. thick over the facing gas box 80 prevents contamination of the silicon wafers 75 during operation of the reactor 60. Quartz is similar to silicon and, thus, does not contaminate the silicon. The quartz covers 81 and 83 also help to eliminate black silicon, because the process reaction with the resulting covers can, if this insulating material is not properly selected, produce a micro-masking effect in the exposed silicon; and this will lead to the production of black silicon. Furthermore, oxygen is released from the quartz during operation of the reactor 60. The released oxygen adds material to the oxide masks which are used for etching materials such as silicon and increases the etch resistance (selectivity) of the mask. The oxygen from the quartz increases the etch rate. The oxygen is additive to that included in etching gas compositions, such as those described in the referenced bromine/iodine etch process, for decreasing bowing and otherwise controlling the etch profile.

Anti-Electrical Breakdown Gas Feed-Through

FIG. 12 is an enlarged vertical cross-section of the gas feed-through device 114 that is used to supply the cooling gas to the RF-powered pedestal 72 without gas breakdown or ionization. The feed-through device comprises a closed cylinder formed by a pair of electrode sections 182 and 184 that have generally parallel, closely spaced, apertured, facing inner walls 186 and 188. The cooling gas enters the feed-through device via inlet 190 in one end cover 191, passes through holes 198 in plate 186, traverses a small gap, d, between the plates, then traverses holes 199 in plate 188 and flows through outlet 192 in the opposite end cover 193. Inlet 190 communicates to the cooling gas supply (not shown) while outlet 192 is connected by line 194 (FIG. 7) to the pedestal passageway 176.

An annular insulating spacer 195 physically and electrically separates the two electrodes 182 and 184. The resulting cylinder assembly is joined by screws 195—195 and is sealed by O-rings 196—196. The inlet electrode 182 is grounded while the outlet electrode 184 is connected in common with the RF-powered pedestal 72. The spacing and size of the holes 198 and 199 and the size of the gap, d, are selected to provide a high gas conductance and prevent ionization of the gas despite the low pressure and high potential across these two adjacent plates. For example, for a gas pressure of 4 torr, a gap, d, of 1–40 mils and a hole diameter of 10–40 mils preclude ionization of the gas. Changing the height of spacer 195 adjusts gap, d, to accommodate different gases and pressures. The device 114 in effect is a compact feed-through for bringing the low pressure cooling gas to the potential of the pedestal despite the sensitivity of the gas to small values of the pressure-distance product.

Clean Operation; Self-Cleaning

Several design features including the controlled reactor wall heating by heating element 181 provide very clean operation of the present etch reactor 60. This, despite the use of processes such as the referenced bromine/iodine etch process, which deliberately use deposit-forming gas compositions for etch profile control, etc. On the average, we have run the reactor for about 100 runs between self-cleaning cycles.

In addition to the long operation time between cleaning, cleaning is made less onerous by the self-cleaning capability of the reactor 60. As is well known, it is more difficult to self-clean the various etch chamber surfaces than to etch a wafer, simply because of the difficulty in expanding the etching gas plasma to cover the large volume and large surface area of the chamber.

In the etch reactor 60, the magnetic field provided by the electromagnet pairs 116-118, 120-122 increases the self-cleaning etch rate, as does high pressure operation. The reactor is designed to run at a range of pressures of from 0.001 torr to 0.300 torr, and thus has the ability to tailor operation to the high pressure requirements of self-cleaning as well as the lower, albeit still relatively high pressure requirements of etching. The rotatable magnetic field and the associated independent control of field strength orientation extend the cleaning plasma everywhere within the chamber, and permit increasing the etch rate for particular regions of the chamber is required, to effectively clean all chamber surfaces.

Furthermore, the use of the powered cathode and the close spacing between the cathode assembly 70 and the anode gas box 80 provide a confined dense plasma. The relatively small size of the chamber, about 13 liters and the circular symmetry of all components also contribute to the self-cleaning capability. Moreover, all exposed surfaces within the chamber are aluminum or quartz, both of which are impervious to and compatible with self-cleaning.

Preferably, a fluorinated gas composition is used for in-situ self-cleaning. Non-carbon, fluorine containing gas compositions such as $NF_3$, $SF_6$ are preferred because of their high volatility of etch products, free of contamination, etc., but others such as $C_2F_6$, $CF_4$ or other fluorine-containing Freons can be used. A presently preferred self-cleaning process uses fluorinated reactive gas chemistry comprising the gases $NF_3$ applied to the chamber 68 at flow rates of 60 sccm, magnetic field strength of 0–45 gauss rotated at 30 cycles per minute, RF forward power of 450 W and 100 mT of chamber pressure. These parameters provide uniform etch on the inner chamber surfaces and will effectively and completely clean the reactor 60 in about 10 mins. after 10 runs (10 microns of silicon is removed in each run). In contrast, conventional plasma etch reactors are cleaned at typical intervals of about 5 runs and require disassembly for cleaning in wet etchants. The combination of in-situ self-cleaning capability, inherently clean operation and long times between cleaning cycles decrease the down time required for cleaning and increase throughput.

Based upon the description of preferred and alternative embodiments of our etch reactor and its use, those of usual skill in the art will readily derive modifications within the scope of our disclosed invention.

What is claimed is:

1. A vacuum processing reactor, comprising a housing defining a vacuum chamber therein adapted for etching a wafer positioned within the chamber at a high rate and with etching uniformity substantially independent of pressure, comprising: a pedestal having a convex-shaped surface for supporting the wafer in a bowed configuration parallel to the pedestal surface; a gas manifold for supplying reactant gases to the chamber; means for applying RF energy between the wafer support pedestal and the gas manifold for generating a wafer etching plasma; electric current-controlled magnetic field generating means for forming a D.C. magnetic field generally parallel to the wafer surface; means for selectively applying current to the field generating means for independently controlling the intensity and orientation of the magnetic field; and means for applying gas under pressure between the surface of the pedestal and the wafer to provide uniform thermal conduction between the wafer and the pedestal.

2. The vacuum processing reactor of claim 1, said D.C. magnetic field forming means comprising at least first and second pairs of electromagnets disposed around the periphery of the housing for forming a magnetic field parallel to the wafer surface; and said current applying means comprising means for applying selected currents to the magnets for stepping the D.C. magnetic field angularly around the wafer to provide a uniform etching plasma.

3. A vacuum processing reactor comprising a housing defining a vacuum chamber therein adapted for processing of a wafer positioned within the chamber, the housing having an opening therein to allow insertion of a horizontally oriented wafer into the chamber, to a first selected position, and removal of the wafer from the chamber; said adaptation further comprising:
- a pedestal assembly having an upper face for supporting the wafer in a generally horizontal orientation, said pedestal face being generally aligned with the first selected position;
- wafer exchange means comprising a group of generally vertically-oriented pins extending through holes in the pedestal; and
- means for sequentially moving the wafer exchange means upwardly and downwardly to selected positions for removing the wafer from the first selected position, clamping the wafer to the pedestal and returning the wafer to the selected position.

4. A vacuum processing reactor comprising a housing defining a vacuum chamber therein adapted for processing of a wafer positioned within the chamber, the housing having an opening therein to allow insertion of a horizontally oriented wafer into the chamber, to a first selected position, and removal of the wafer from the chamber; said adaptation further comprising:
- a pedestal assembly having a horizontal upper face for supporting the wafer, said pedestal face being generally aligned with the first selected position;
- wafer exchange means comprising a clamping ring means having the axis thereof oriented generally parallel to the pedestal and a group of generally vertically oriented pins arranged in a circular array of diameter less than the clamp ring diameter, said upper ends of the pins being spaced vertically below said clamping ring; and
- means for sequentially moving the wafer exchange means upwardly and downwardly to selected positions for removing the wafer from the first selected position, clamping the wafer to the pedestal and returning the wafer to the selected position.

5. The reactor of claim 1, 2 or 3, further comprising a clamping ring means having fingers extending inwardly generally parallel to the pedestal or electrode for clamping the wafer thereto.

6. The reactor of claim 3 or 4, further comprising means for applying RF energy to the pedestal.

7. The reactor of any of claim 1, 2 or 3, further comprising means for circulating cooling fluid within the pedestal.

8. The reactor of claim 7, further comprising means disposed on the exterior of the reactor for heating the internal reactor surfaces to a predetermined temperature for preventing deposits on said surfaces.

9. The vacuum processing reactor of claim 7, further comprising feed-through device for coupling the cooling gas at low pressure to the powered pedestal without ionization, comprising a housing having a gas inlet adapted for receiving the cooling gas and a spaced gas outlet connected to the pedestal, said housing further comprising a pair of internal, closely spaced apertured plates transversely spanning the path of the gas, one of the said plates on the outlet side of the gas flow being connected electrically in common with the pedestal, and the other plate being connected to system ground.

10. The reactor of any of claim 1, 2 or 3, further comprising an etch impervious coating of material such as quartz over the ga manifold and clamp ring.

11. A vacuum processing reactor comprising a housing defining a vacuum chamber therein adapted for the processing of a wafer positioned within the chamber, the housing having an opening therein for receiving a wafer-support blade and further comprising:
- means for lifting the wafer from the blade, positioning of the wafer on the pedestal, and returning the wafer to the blade;
- a gas manifold for supplying reactive gas to the chamber;
- means for applying RF energy between the pedestal and the manifold to form an etching plasma from the reactive gas for etching the wafer; and
- magnetic field generating means comprising at least first and second pairs of electromagnets disposed about the housing for forming a D.C. magnetic field parallel to the wafer surface; and means for applying current to the electromagnets to step the D.C. field over the surface of the wafer to provide a uniform etch plasma.

12. The vacuum processing reactor of claim 11, wherein the pedestal has a convex surface for supporting the wafer and further comprising means for clamping the wafer against the pedestal support surface, means for circulating cooling fluid within the pedestal and means for applying gas at low pressure between the pedestal face and a wafer on the pedestal to enhance thermal conductivity between the wafer and the pedestal.

13. The vacuum processing reactor of claim 12, further comprising a feed-through device for coupling the cooling gas at low pressure to the powered pedestal without ionization, comprising a housing having a gas inlet adapted for receiving the cooling gas and a spaced gas outlet connected to the pedestal, said housing further comprising a pair of internal, closely spaced apertured plates transversely spanning the path of the gas, one of the said plates on the outlet side of the gas flow being connected electrically in common with the pedestal, and the other plate being connected to system ground.

14. The reactor of claim 13, further comprising means disposed on the exterior of the reactor for heating the internal reactor surfaces to a predetermined temperature for preventing deposits on said surfaces.

15. The reactor of claim 13 or 14, further comprising an etch impervious coating of material over the gas manifold and clamp ring.

16. The reactor of claim 15, wherein the coating is quartz.

* * * * *